United States Patent [19]

Imura et al.

[11] Patent Number: 4,659,587

[45] Date of Patent: Apr. 21, 1987

[54] ELECTROLESS PLATING PROCESS AND PROCESS FOR PRODUCING MULTILAYER WIRING BOARD

[75] Inventors: Midori Imura, Tokyo; Makoto Morijiri, Hitachi; Masanobu Hanazono, Mito; Shinichi Kazui, Hadano; Youzi Miura, Hitachi; Hiroyuki Ogino, Hadano, all of Japan

[73] Assignee: Hitachi, Ltd., Tokyo, Japan

[21] Appl. No.: 786,056

[22] Filed: Oct. 10, 1985

[30] Foreign Application Priority Data

Oct. 11, 1984 [JP] Japan ................................. 59-211355
Oct. 27, 1984 [JP] Japan ................................. 59-225134
Feb. 15, 1985 [JP] Japan ................................. 60-26421

[51] Int. Cl.$^4$ ............................................. C23C 18/16
[52] U.S. Cl. ........................................... 427/35; 427/36; 427/45.1; 427/53.1; 427/98; 427/92; 427/97
[58] Field of Search ................. 427/53.1, 98, 92, 36, 427/35, 43.1, 97

[56] References Cited

U.S. PATENT DOCUMENTS 4,239,789 12/1980 Blum .................................. 427/53.1
4,511,595 4/1985 Inoue .................................. 427/53.1
4,517,254 5/1985 Grapentin ........................... 427/306
4,526,807 7/1985 Auerbach ............................ 427/98

FOREIGN PATENT DOCUMENTS 58-64368 4/1983 Japan.

Primary Examiner—John D. Smith
Attorney, Agent, or Firm—Antonelli, Terry & Wands

[57] ABSTRACT

In a selective electroless plating process suitable for formation and correction of a minute pattern by plating film, irradiation of the surface of a workpiece with a laser beam serves to selectively activate the surface of the workpiece to allow an electroless plating film to deposited on only the activated portions. The portion of the workpiece where plating is effected is irradiated with a radiation energy beam to form a damaged portion, which is contact with a plating bath during and/or after the irradiation to selectively from a plating film on the damaged portion. The portion of a workpiece where a pole as the connector part of a multilayer wiring board is to be formed is irradiated with a laser beam and allowed to have a pole selectively formed only thereon.

15 Claims, 22 Drawing Figures

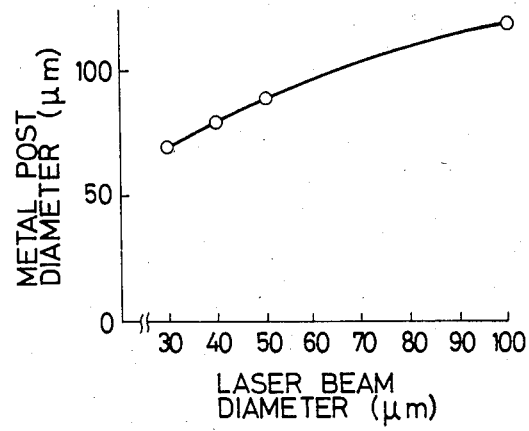
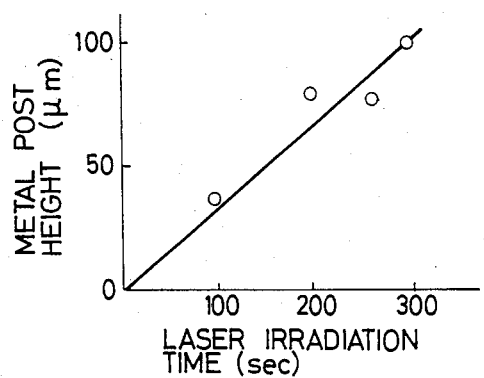
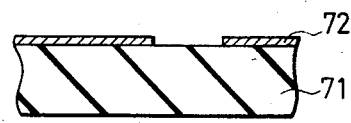
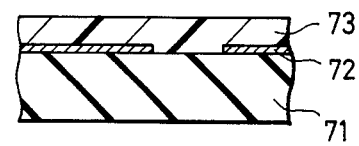
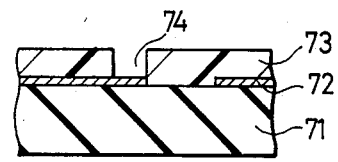
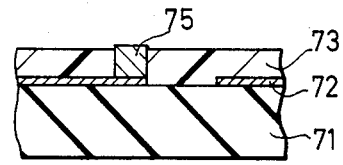
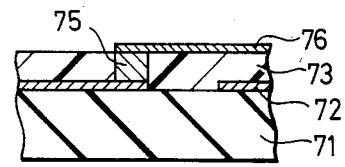

ELECTROLESS PLATING PROCESS AND PROCESS FOR PRODUCING MULTILAYER WIRING BOARD

BACKGROUND OF THE INVENTION

1. Field of the Invention

The present invention relates to an electroless plating process capable of selectively forming a plating film on the surface of a workpiece and a process for producing a multilayer wiring board utilizing the electroless plating process. Particularly the present invention relates to a selective electroless plating process suitable for formation and correction of a minute pattern by a plating film, and a process for producing a multilayer wiring board according to which a connector part is formed by the mask-less utilizing the above electroless plating process.

2. Prior Art of the Invention

The electroless plating techniques have been employed for the plating of various kinds of insulators, semiconductors, etc. Recently, the electroless plating techniques have begun to be employed in formation and correction of a conductor pattern on a circuit board, etc. Thus the selective electroless plating techniques, which is employed the plating on only a predetermined portion of the surface of the circuit board, have attracted attention.

One of the kind selective electroless plating techniques is a process comprising irradiation with a radiation energy beam. (U.S. Pat. No. 4,239,789).

In this conventional electroless plating process, a workpiece is immersed in an electroless plating bath filled in a container. The portion of the surface of the workpiece where a plating film is to be formed is irradiated with a laser beam through a modulator or a condenser lens from an energy source. As a result, the portion of the workpiece which is being irradiated with the laser beam is heated, and a plating film is selectively formed on only the portion thus heated.

The selective electroless plating process is applied to formation of a conductor pattern on a circuit board, etc. Since the surface of a workpiece is different in substance from ions to be deposited thereon, the surface of the workpiece must be preliminarily activated by, for example, immersing the workpiece in a solution of palladium chloride before the selective plating treatment.

Accordingly, in the conventional selective electroless plating technique, there has been a problem that sufficient selectivity by an energy beam is not attained since a plating film is formed all over the activated surface when the workpiece is merely immersed in the electroless plating bath.

One of the selective electroless plating processes is a process as disclosed in the Japanese Patent Laid-Open No. 64368/1983, in which silica for IC is used as the workpiece and the following electroless plating bath is used:

$(HCHO)_n$: 0.1 mol/cm$^3$
$CuSO_4$: 0.05 mol/cm$^3$
EDTA.disodium salt: 0.15 mol/cm$^3$
NaOH: adjustment of pH to 12.5

Here, EDTA is ethylenediaminetetraacetic acid.

Accordingly, ions present in the plating bath are Cu which is different from silica as the workpiece. Thus the workpiece must be subjected to the following activation treatment.

Pretreatment is first carried out which consisting of water washing, a cleaning treatment with an about 10% solution of NaOH, water washing, an acid washing treatment with an about 3.5% solution of HCl, water washing, and drying. Subsequently, the workpiece is subjected to a sensitization treatment with a treating liquid composed of about 10 g/l of SnCl and about 20 to 50 g/l of HCl, followed by moderate water washing.

Subsequently, the workpiece is subjected to an activation treatment with an activating liquid of about 0.2 g/l of $PdCl_2$ adjusted to a pH of 3 to 4 with a pH adjustor HCl at about 50° C. to substitute Pd for Sn. Thus a substance, which serves as plating nuclei in chemical plating, is stuck to the workpiece. The resulting workpiece is then washed with water, dried, and, if desired, cooled and stored.

Subsequently, the workpiece thus activated is immersed in an electroless plating bath having the above-mentioned composition, and irradiated, on the surface to be plated, with a laser beam emitted from an about 15 W argon laser and condensed to a diameter of 15 μm. A plating film is formed in the portion irradiated with the laser beam. Thus selective electroless plating is effected.

However, where the workpiece activated is immersed in the electroless plating bath having the above-mentioned composition, electroless plating is allowed to progress to some extent at ordinary temperatures even if the workpiece remains as it is, leading to deposition of a plating film. Therefore, in the conventional selective electroless plating technique, the plating path and the workpiece must be kept at around 5° C. or a lower temperature, thus presenting a problem of a troublesome plating treatment.

Furthermore, since the surface of the workpiece is already activated all over, deposition of a plating film cannot be completely suppressed even if temperature control as mentioned above is made, thus presenting another problem of insufficient selectively.

As described above, in the selective electroless plating wherein the surface of the workpiece is different in substance from plating ions in the electroless plating bath, the surface has conventionally been subjected to the activation treatment before the plating treatment. This procedure aims at preliminarily adhering fine particles, acting as nuclei of growth of a metal to be deposited and, hence, as the catalyst of the plating reaction, on the surface of the workpiece. The plating reaction has conventionally been initiated by the nuclei.

It has been believed that the plating reaction cannot be controlled without this activation treatment. Thus this treatment has always been effected in the conventional selective electroless plating technique. A confirmative experiment conducted by the inventors of the present invention provided that, as a result of the activation treatment, deposition of a thin plating film was observed all over the surface of the workpiece where the activation treatment was effected, even in the portion not irradiated with the energy beam when the temperature of the plating bath was normal, and that, even when the bath temperature was 5° C. at which electroless plating was not believed to progress substantially, deposition of a plating film in an innegligible amount was observed over a considerably wide area of the portion not irradiated with the energy beam.

Further, according to the prior art selective electroless plating technique, a selective chemical or thermal reaction is effected on a workpiece by using a laser beam to form a pattern on the workpiece. At this time, the workpiece is not affected at all. More specifically, active sites are imparted to the workpiece by an activating agent, and a plating film is formed on the active sites. Therefore, the material itself of the workpiece is not changed at all before and after irradiation with the laser beam.

A printed circuit board is used for mounting parts on an electronic apparatus and efficiently carrying out wiring between the parts. The printed circuit board shows a general trend toward a multilayer structure for improving the packaged density. There are various methods for bonding between the layers of the multilayer board.

The procedure of layer build-up is as follows. A photoresist is applied on a carrier metal, followed by pattern light exposure and development. Subsequently, Au, Cu, or the like is deposited on the metal, followed by removal of the resist. Etching is effected to form a plated pattern. Subsequently, a polyimide film is formed to flatten the surface. Thus the first layer is formed.

This process is repeated to form a multilayer circuit board. Formation of the interlayer portion between the first layer and the second layer requires repetition of the same process three times. This is because the height of a plating film built up at one run is, for example, 30 μm or less as against 100 μm necessary for a distance between the layers.

Thus the procedure of layer build-up is an effective method capable of coping with the trend toward a higher packaging density of the printed circuit board. However, there is a problem that the procedure involves an increased number of steps, particularly a large number of steps for providing connector parts between the layers.

SUMMARY OF THE INVENTION

An object of the present invention is to provide an electroless plating process capable of easily effecting sufficiently selective formation of a precise conductor pattern by irradiation with an energy beam.

Another object of the present invention is to provide an electroless plating process capable of forming a plating film with a good adhesion by irradiation with an energy beam.

Still another object of the present invention is to provide a process for producing a multilayer wiring board wherein the number of steps by maskless formation of connector parts between the layers can be decreased.

Further object of the present invention is to provide a process for producing a multilayer wiring board wherein the formation of interlayer connector parts can be effected under arbitrary control of the height of plated poles formed in the connector parts.

The inventors of the present invention have found that, when a workpiece is directly irradiated with an energy beam, an activation phenomenon appears in the portions irradiated with the energy beam. Based on this finding, the inventors have established a method of activating a workpiece by irradiation with an energy beam to thereby enable electroless plating to be sufficiently selectively conducted.

Thus the present invention is characterized in that irradiation of the surface of a workpiece with an energy beam serves to selectively activate the surface of the workpiece to allow an electroless plating film to be deposited on only the activated portions.

Further, the present invention is characterized in that the portion of a workpiece where plating is effected is irradiated with a radiation energy beam to form a damaged portion, which is in contact with a plating bath during and/or after the irradiation to selectively form a plating film on the damaged portion.

Furthermore, the present invention is characterized in that only the portion of a workpiece where a pole as the connector part of a multilayer wiring board is to be formed is irradiated with a laser beam and allowed to have a pole selectively formed only thereon, the height of which can be arbitrarily chosen by controlling the time of irradiation with the laser beam so that one step of processing can accommodate itself to even a large interlayer thickness.

In the process of electroless plating by irradiation with an energy beam, the laser beam irradiating a workpiece brings about a localized temperature increase of the workpiece to serve for promoting a plating reaction, too. Also in the present invention, a workpiece having a lower thermal conductivity has a high efficiency of utilization of an energy beam.

Materials of workpieces which can be employed in the process of the present invention include organic and inorganic materials, examples of which include organic materials such as polyimides, glass-epoxies, fiber-epoxies containing a fiber other than a glass fiber, Teflon, and polybutadiene; inorganic materials such as an ITO transparent electrode, silica, and alumina; semiconductors such as Ga-As and In-Sb; and a glass substrate having a thin metal film thereon.

Examples of radiation energy beams include high-energy radiation beams such as a laser beam, an X ray, and an electron beam, among which a laser beam is preferred.

Electroless plating baths include not only those for copper plating but also an electroless nickel plating bath, for example, mainly composed of $NiSO_4$, $NaH_2PO_2$, $NH_4Cl$, and $NaOH$, which also can be employed for electroless plating with a sufficient selectivity.

As described above, there is a conventional selective electroless plating technique according to which the portion of a workpiece where plating is to be effected is contacted with an electroless plating bath and irradiated with a radiation energy beam for promoting plating to effect selective plating.

The inventors of the present invention applied this technique to a process of forming a Cu pattern on a polyimide substrate. An argon laser was chosen as the radiation energy beam. A relationship between the laser output and the state of a plating film formed was examined. As a result, it was found that a plating film having a good adhesion is obtained critically when the laser output is increased above a given level. Detailed examination of plating films obtained revealed that a plating film having a good adhesion was formed on a slightly damaged portion of the polyimide substrate.

The inventors of the present invention have found that, when laser irradiation can give a damage to a substrate, selective formation of a plating film on the substrate can be effected by immersing it in a chemical plating bath heated even without a preliminary activation treatment.

Irradiation with a radiation energy beam may be effected either in air according to the dry process or in a liquid according to the wet process. In the wet process, either a consecutive procedure of irradiation, for example, in distilled water and subsequent plating or a simultaneous procedure of irradiation in a plating bath to effect plating simultaneously with formation of the damaged portion may be adopted.

In order to suppress the temperature rise of the portion other than the damaged portion due to diffusion of heat of irradiation, irradiation may be made while cooling the portion other than the one where plating is to be made.

The irradiation conditions in the process of the present invention varies according to the consecutive or simultaneous procedure, the dry or wet process, the properties of a workpiece material, the kind and intensity of radiation energy beam, the amount of a metal deposited as a film, etc.

In any case, however, intense irradiation must be effected to give a more damage to the portion where plating is to be effected than that in the case of the conventional process, as described above. The irradiation conditions can be easily determined by a preliminary experiment.

BRIEF DESCRIPTION OF THE DRAWINGS

FIG. 8 is a characteristic diagram illustrating a relationship between the diameter of a laser beam and that of a plated pole.

FIG. 9 is a characteristic diagram illustrating a relationship between the time of laser irradiation and the height of a plated pole.

FIGS. 10(A), 10(B), 10(C), 10(D) and 10(E) are process illustrations of production of a multilayer wiring board according to another embodiment of the present invention.

DETAILED DESCRIPTION OF THE PREFERRED EMBODIMENTS

The electroless plating process according to the present invention will now be described.

EXAMPLE 1

Figure 1:
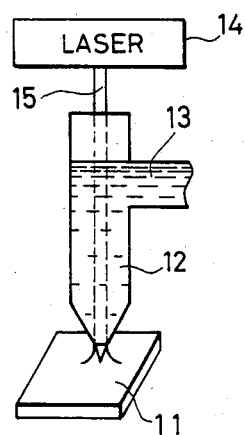
FIG. 1 is a partially diagrammatic sectional view of an embodiment of the electroless plating process of the present invention.

FIG. 1 illustrates an embodiment of the present invention. A workpiece 11 is immersed in an electroless plating liquid 13 filled in a plating cell 12. The surface portion of the workpiece 11 where a plating film is to be formed is irradiated with an energy beam such as a laser beam from an energy source 14 such as a laser. The portion of the workpiece 11 irradiated with the laser beam is heated and a plating film is selectively formed on only the heated portion.

The energy source 14 is an argon laser having an output of 1.0 W and a wavelength of 488 nm. A laser beam emitted at that output is guided to the surface of the workpiece 11 by an optical fiber 15.

The plating cell 12 is a high-speed plating cell of a nozzle type which performs plating by ejecting an electroless plating liquid 13 from a nozzle toward the surface of the workpiece 11 at a flow rate of 60 ml/min. The optical fiber 15 is passed through the plating cell 13 and allows the laser beam to irradiate the surface of the workpiece 11 from the nozzle. The composition of the electroless plating liquid 13 is as shown in Table 1.

TABLE 1

| | Ingredient | Content (in 1 liter) |
|---|---|---|
| Basic ingredient | | |
| Copper salt | $CuSO_4.5H_2O$ | 10 g |
| Complexing agent | $EDTA\ Na_2.2H_2O$ | 30 g |
| Reducing agent | HCHO (37%) | 20 ml |
| pH adjuster | NaOH | such an amount as to make the pH 12.8 at 20° C. |
| Additives | PEG ($\overline{M}w$: 600) | 10 ml |
| | 2,2'-dipyridyl | 20 ml |

Here, PEG means polyethylene glycol, and $\overline{M}w$ represents a molecular weight.

The workpiece 11 is a polyimide circuit board having a pattern of a thin copper film formed on the surface thereof. The portion to be plated on the surface of the workpiece 11 consints of a different substance from plating ions, namely Cu ions, contained in the electroless plating liquid 13.

The workpiece 11 is subjected to general steps of pretreatments such as water washing, surface roughening, and surface washing for cleaning the surface thereof. Thereafter, the workpiece 11 is subjected, as it is, namely without any activation treatment, to a step of electroless plating, during which the temperature of the electroless plating liquid 13 and that of the workpiece 11 are preferably kept in a range of from ordinary temperatures to about 60° C.

The plating cell 12 is moved at a given rate, for example, at a rate of 10 μm/sec., to allow the electroless plating liquid 13 ejected from the nozzle to continuously run along the portion to be plated on the surface of the workpiece 11. During that time, the portion of the workpiece 11 where plating is to be effected is irradiated with a laser beam.

Active sites (minute activated areas) are formed in only the portion irradiated with the laser beam in the area on the surface of the workpiece 11 to which area the electroless plating liquid 13 is being ejected.

The active sites are areas serving as growth nuclei in the plating reaction which serve as a catalyst for the plating reaction to initiate the plating reaction, and which serve to improve the adhesion of a plating film, too. In these active sites, the plating reaction occurs to form a pattern of a copper plating film having a width of 100 μm and a thickness of 40 μm in only the portion of the workpiece 11 irradiated with the laser beam.

The significance of activation of the reaction in the active sites is not merely an increase in the reaction rate but also the initiation of the reaction, an improvement of the adhesion of the plating film, and enabling of the subsequent continuation of the reaction in accordance with transfer of active sites.

Here, the selectivity (feature showing whether or not formation of a plating film is effected in only the portion where a plating film is needed) of the plating film formed in Example 1 described with reference to FIG. 1, and the selectivities of plating films formed according to conventional techniques will now be discussed with reference to FIGS. 2(A) to (D) showing the results of EDX analysis (energy dispersive X-ray analysis).

The EDX analysis is a method of analyzing elements present in a portion of a sample irradiated with an electron beam by examining an X-ray emitted from the portion irradiated with the electron beam.

Figure 2A:
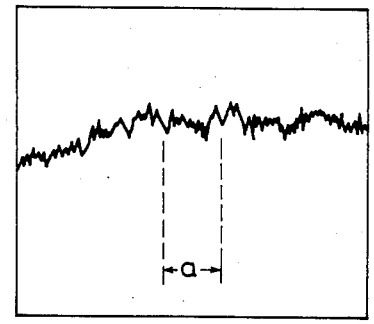
FIGS. 2(A), 2(B), 2(C), and 2(D) are comparative illustrations of EDX analysis results of the conventional techniques and the technique of the present invention.
Figure 2B:
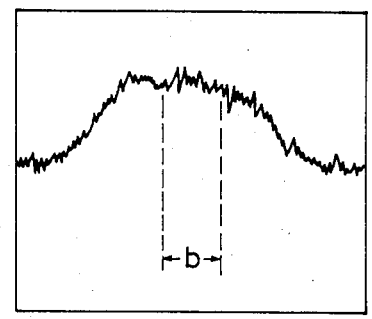
Figure 2C:
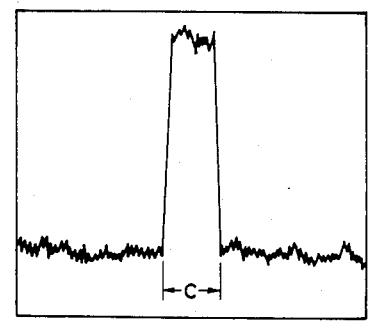
Figure 2D:
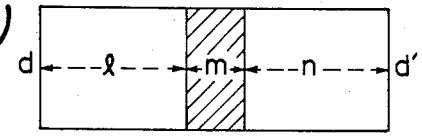

Here, a sample having a copper plating film formed in a portion to the surface of a substrate (workpiece) by irradiation with an energy beam as shown by a hatched portion m in FIG. 2(D) is subjected to scanning of an electron beam along the d—d' line in FIG. 2(D) to find the results of analysis by a characteristic X-ray of Cu as shown in FIGS. 2(A), 2(B), and 2(C).

In these figures, the ordinate represents the intensity of the characteristic X-ray of Cu, and the abscissa the position along the d—d' line in FIG. 2(D). In FIG. 2(D), the blank portions l and n represent portions where the surface of the substrate is exposed. During the EDX analysis along the d—d' line, an electron beam is scanned on the surface of the substrate in the portions l and n and on the plating film in the portion m to carry out analysis.

FIGS. 2(A) and 2(B) are graphs showing the results of samples having respective copper plated portions m formed by the conventional electroless plating processes utilizing irradiation with an energy beam.

FIG. 2(A) shows the results of a sample obtained by subjecting a polyimide board to an activation treatment according to the procedure as described in Prior Art of the invention and plating the activated board using the same device as used in Example 1 according to the present invention and as shown in FIG. 1 while keeping the temperatures of both the electroless plating liquid and the board at 22° C.

In this case, no significant difference in the intensity of an X-ray is observed between the portion of a plating film (portion a) and the other portions. Thus it is understood that Cu is deposited on the portions of the board [portions l and n in FIG. 2(D)].

FIG. 2(B) shows the results of a sample obtained in substantially the same manner as in the case of FIG. 2(A) except that the temperatures of both the board and the electroless plating liquid are kept at 7° C.

In this case, a broad peak of the X-ray intensity with a center corresponding to the portion of a plating film (portion b) is observed, and the X-ray intensity is considerably high all over.

Thus, in this case, a certain amount of Cu is present in the background (board portion) other than the plated portion as in case of FIG. 2(A). This demonstrates that plating progressed in the background, too. Thus, the selectivity of plating can be hardly attained according to the conventional processes.

Incidentally, in the case of FIG. 2(B), the temperature is set at 7° C. because plating in the background is scarcely allowed to progress in the conventional techniques when the temperature is lowered to this level.

FIG. 2(C) shows the results of a sample produced in Example 1 according to the present invention. In this case, a sharp peak of the X-ray intensity appears in the portion of a plating film (portion c), while the X-ray intensity in the background is maintained at zero.

Thus it can be understood that plating is not effected at all in the portion not irradiated with the laser beam with a very excellent selectivity. Incidentally, no deposition of Cu in the background of the sample produced in this Example was confirmed by point analysis (EDX analysis) in an arbitrary point chosen in the board portion.

As described above, according to the embodiment of the present invention, electroless plating is effected with certainty on only the portion irradiated with an energy beam. Accordingly, the process is applicable, with easiness in obtaining a very high selectivity, to formation of a precise pattern by an electroless plating film as in the case of production of a circuit board.

Furthermore, according to the embodiment of the present invention, an adequately rough surface (damaged portion after mentioned) is formed in the portion of the workpiece irradiated with the energy beam. Therefore, a good adhesion is attained between the electroless plating film formed and the workpiece. Thus, pattern formation with an excellent mechanical strength can be easily achieved.

Moreover, according to this embodiment of the present invention, the activation treatment included in the pretreatment in electroless plating can be dispensed with. Thus the process is simplified with an expectation of cost reduction.

EXAMPLE 2

Figure 3:
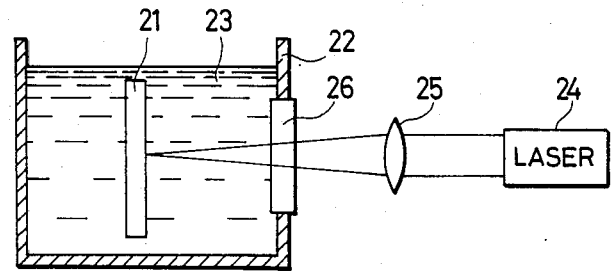
FIG. 3 is a partially diagrammatic sectional view of another embodiment of the electroless plating process of the present invention.

The second embodiment of the present invention will now be explained with reference to FIG. 3. A workpiece 21 is immersed in a treatment liquid 23 filled in a container 22. The workpiece 21 is irradiated with an energy beam through a glass window 26 via a condenser lens system 25 from an energy source 24, which is an argon laser having an output of 500 mW, a wavelength of 488 nm, and a spot diameter of 50 μm.

A predetermined portion of the workpiece 21 is irradiated with a laser beam emitted from the argon laser, condensed with the lens system 5, and passed thereby through the glass window 26 of a flat optical glass provided in the container 22. The treatment liquid 23 filled in the container 22 has a composition as shown in Table 2.

TABLE 2

| Ingredient | Content (in 1 liter) |
|---|---|
| Basic ingredient | |
| EDTA Na$_2$.2H$_2$O | 30 g |
| HCHO (37%) | 20 ml |
| NaOH | such an amount as to make the pH 12.8 at 20° C. |
| Additive | |
| PEG ($\overline{M}$w: 600) | 10 ml |
| 2,2'-dipyridyl | 20 mg |

As is apparent from a comparison between Table 2 and Table 1 in Example 1, a difference between the treatment liquid 23 and the electroless plating liquid 13 used in Example 1 consists in whether plating ions are contained or not.

The workpiece 21, which is a polyimide board, is immersed in a treatment liquid 23, and irradiated with the laser beam in a predetermined portion on the surface thereof. The irradiated portion is shifted at a rate of 1 μm/sec.

According to the observation of the workpiece 21, there appears a phenomenon that the board surface is roughened and exposed to some extent. However, since plating ions are not contained in the treatment liquid 23, nothing in particular is observed following the above-mentioned phenomenon, not to mention a plating reaction.

The foregoing procedure is herein referred to as the "step 1". Subsequently, the workpiece 21 already subjected to the step 1 is immersed in an electroless plating liquid 13 having a composition as shown in Table 1 in the Example 1. The liquid temperature is kept at 70° C. for 10 minutes and subsequently at 90° C. for 10 minutes. The procedure is herein referred to as the "step 2".

By virtue of the step 2, the plating reaction appears in only the portion of the workpiece 21 irradiated with the laser beam in the step 1 to selectively deposit a copper plating film thereon.

It can be understood that, according to this embodiment, active sites are formed upon irradiation with the laser beam to allow the electroless plating reaction to be selectively effected in only the portion where they are present.

EXAMPLE 3

Figure 4:
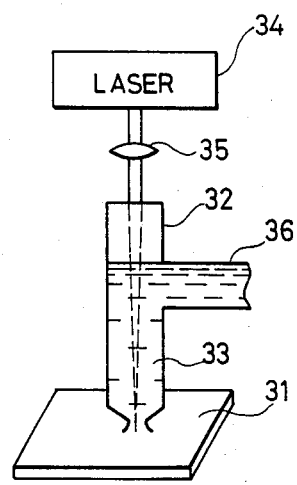
FIG. 4 is a partially diagrammatic sectional view of still another embodiment of the present invention.

In FIG. 4, a polyimide board 31 as a workpiece is immersed in an electroless plating bath 33 filled in a plating cell 32. The polyimide board 31 is irradiated with a laser beam emitted from an energy source 34 and passed through a lens system 35. The plating cell 32 includes a liquid supply inlet 36.

The energy source 34 is an argon laser having a wavelength of 488 nm and an output of 1 W. The laser beam is emitted from this energy source 34, passed through the lens 35, and introduced into the plating cell 32 having a nozzle shape.

The cell 32 is a high speed plating cell which ejects the electroless plating liquid 33 at a rate of 10 $\mu$m/sec. The electroless plating liquid 33 has a composition as shown in Table 1 in Example 1. The workpiece 31 to be plated is a polyimide board having a thickness of 200 $\mu$m.

The plating cell 32 moves over the workpiece 31 at a rate of 1 $\mu$m/sec. In this case, any preliminary activation of the surface of the workpiece 31 is not needed. The temperature of the plating liquid 33 is desired to be in a range of from ordinary temperatures to about 75° C.

In Example 3, the foregoing procedures give a damaged portion (recession) having a width of 100 $\mu$m and an average depth of 5 $\mu$m to the polyimide board 31, and form a plating film having a width of 100 $\mu$m and a thickness of 40 $\mu$m thereon.

The plating film has such a good adhesion to the polyimide board 31 that peeling off of the plating film cannot be observed in a tape test in accordance with the JIS standard "Methods of Test for Printed Wiring Boards. 8.3.2. Plating adhesion test."

By contrast, when the output of the argon laser emitted from the energy source 34 is lowered to 700 mW, a plating film having a width of 100 $\mu$m and a thickness of 30 $\mu$m is formed while no damaged portion is recognized beneath the plating film. When the plating film is subjected to the above-mentioned tape test, the film is peeled off in only one run.

As described above, according to the embodiment of Example 3 (laser output: 1 W), selective formation of a plating film in only the laser-irradiated portion, namely the damaged portion, of a board is possible. Furthermore, since plating is effected on the damaged portion, a plating film having a good adhesion to the board can be formed.

As described above, according to the embodiment of the present invention, there is provided a simple process of forming a maskless pattern by giving a damage to the portion of a workpiece where plating is to be effected and selectively forming a plating film in only the above-mentioned portion. Moreover, the plating film obtained has a good adhesion to the workpiece.

EXAMPLE 4

Figure 5A:
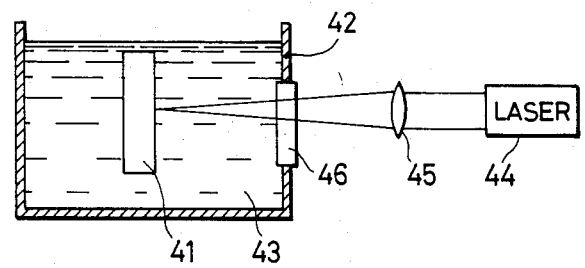
FIG. 5(A) is a partially diagrammatic sectional view of damaging of a portion of a substrate.

The fourth embodiment of the present invention will now be explained with reference to FIGS. 5(A) and 5(B). In FIG. 5(A) illustrating damaging of a portion of a workpiece, a polyimide board 41 is immersed in distilled water 43 filled in an irradiation cell 42. The polyimide board 41 is irradiated with a laser beam through a lens 45 from an energy source 44. The irradiation cell 42 includes an optical glass 46.

Figure 5B:
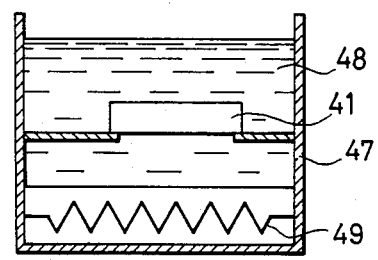
FIG. 5(B) is a partially diagrammatic sectional view of plating on a portion of a substrate.

FIG. 5(B) illustrates plating of a portion of a workpiece. The polyimide board 41 is immersed in a plating cell 47 containing an electroless plating liquid 48. The plating cell 47 includes a temperature controller 49.

The energy source 44 is an argon laser having a wavelength of 488 nm and an output of 500 mW. A portion to be plated in the polyimide board 41 in the plating cell 42 is irradiated with a laser beam emitted from this energy source 44 and passed through the lens 45 and the optical glass 46 set in the plating cell 42. The plating cell 42 contains distilled water 43 having a temperature of 20° C. The laser beam is scanned over the polyimide board 41 at a sweep rate of 1 $\mu$m/sec to give a damage having a width of 50 $\mu$m and a depth of 10 $\mu$m to the polyimide board 41.

Subsequently, the polyimide board 41 is immersed in the cell 47 as shown in FIG. 5(B). The cell 47 contains the electroless plating liquid 48 having a composition as shown in Table 1 in Example 1. The temperature of the electroless plating liquid 48 is controlled by the temperature controller 49.

The liquid temperature is kept at 90° C. for 10 minutes and at 70° C. for 60 minutes to form a plating film having a width of 50 $\mu$m and a thickness of 6 $\mu$m on only the damaged portion.

The polyimide board 41 may be left immersed in the electroless plating liquid 48 till a desired thickness is attained. Alternatively, since a plating ground is already formed, electrolytic plating may be effected using an electrolytic plating liquid as shown in Table 3 to form a plating film having a desired thickness faster.

TABLE 3

| Ingredient | Content (in 1 liter) |
| --- | --- |
| $CuSO_4.5H_2O$ | 225 g |
| $H_2SO_4$ | 40 ml |
| HCl (10%) | 0.6 ml |

The plating film has such a good adhesion that peeling off of the film cannot be recognized in the tape test in accordance with the JIS standard. The damaged portion may not necessarily be formed in distilled water.

EXAMPLE 5

Figure 6:
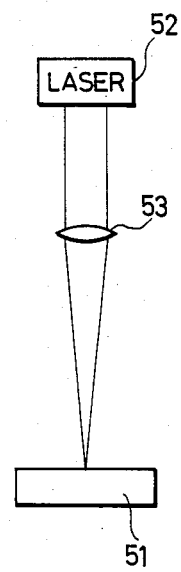
FIG. 6 is an illustration of irradiation of a laser beam for forming a damaged portion according to an embodiment of the present invention.

The fifth embodiment of the present invention will now be explained with reference to FIG. 6. The energy source 52 is a YAG laser having a wavelength of 1.06 $\mu$m and an output of 200 mW. A portion of the polyimide board 51 where plating is to be effected is irradiated with a laser beam through the lens 53 from the energy source. When the laser beam is scanned over the polyimide board 51 at a sweep rate of 10 $\mu$m/sec, a damage having a width of 70 $\mu$m and a depth of 10 $\mu$m is given to the polyimide board 51.

Subsequently, the polyimide board 51 is immersed in the cell 47 as shown in FIG. 5(B), and a plating film is formed on only the damaged portion in the same manner as in Example 4. The plating film has such a good adhesion that peeling off of the film cannot be recognized in a tape test in accordance with the JIS standard.

As described above, according to the embodiment of the present invention, selective formation of a plating film on only a damaged portion can be effected by giving a damage to a portion of a workpiece where plating is to be effected with a radiation energy beam irradiating the same and subsequently contacting the portion with an electroless plating liquid.

EXAMPLE 6

The sixth embodiment of the present invention, in which maskless formation of a connector part of a multilayer wiring board is effected by the electroless plating method, will now be explained with reference to FIG. 7.

Figure 7A:
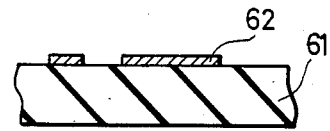
FIGS. 7(A), 7(B), 7(C), 7(D), and 7(E) are process illustrations of production of a multilayer wiring board according to an embodiment of the present invention.

An insulating board 61 is subjected to formation thereon of a metal foil for a conductor circuit, coating of a photoresist, pattern light exposure, development, plating of Cu, removal of the resist, and etching to form a first layer pattern 62 as shown in FIG. 7(A).

Figure 7B:
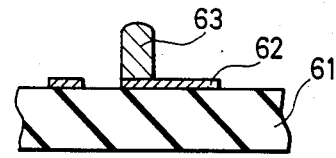

Subsequently, a Cu pole 63 is selectively formed in a desire portion for interlayer connection (see FIG. 7(B)). The Cu pole 63 can be formed by immersing the insulating board 61 in a Cu plating liquid and statically irradiating the insulating board 61 with a laser beam, or by locally supplying a Cu plating liquid to the insulating board 61, and irradiating the insulating board 61 with a laser beam. In this Example, a Cu chemical plating liquid as shown in Table 1 in Example 1 is used as the plating liquid.

An argon laser having an output of 1.0 W and a wavelength of 488 nm is used as the laser beam source. Irradiation is made after the beam is condensed to a beam diameter of 30 $\mu$m. Simultaneously, the chemical Cu plating liquid as shown in Table 1 in Example 1 is ejected from a nozzle-form cell at a rate of 60 m/min. As a result, a Cu pole 73 having a diameter of 70 $\mu$m and a height of 100 $\mu$m as shown in FIG. 7(B) is formed in 300 seconds.

The diameter of the pole thus formed can be controlled by the diameter of the irradiating laser beam. The relationship therebetween is shown in FIG. 8.

The height of the pole thus formed can be controlled by the irradiating time of the laser beam. The relationship therebetween is shown in FIG. 9.

Figure 7C:
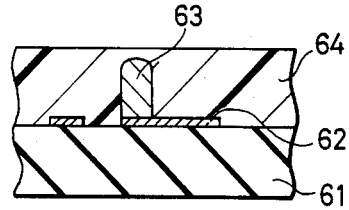
Figure 7D:
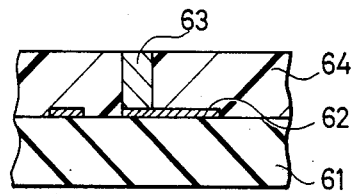

Following the formation of the pole by plating, a polyimide film 64 (insulating film) is formed as shown in FIG. 7(C). Subsequently, the upper portion is flattened by surface polishing as shown in FIG. 7(D). The procedures as shown in FIGS. 7(B), 7(C), and 7(D) are necessary steps for forming an interlayer connecting portion in this Example.

Figure 7E:
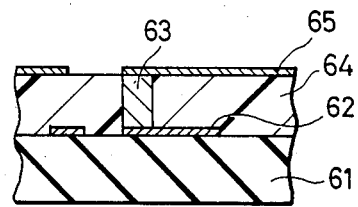

Subsequently, a second layer pattern 65 as shown in FIG. 7(E) is formed by coating of a photoresist, pattern exposure, development, plating, removal of the resist, and etching. Repetition of this process can afford a multilayer wiring board.

Incidentally, in this Example, the first layer pattern 62 and the second layer pattern 65 are formed using a photoresist. Alternatively, however, where the number of patterns to be formed is small, direct drawing of patterns may be made using a cell and a plating liquid as used in the formation of the pole 63 by plating.

In accordance with the embodiment of the present invention, there is provided a process of forming an interlayer connector part with a decreased number of steps by virtue of maskless formation of an interlayer connector part. Furthermore, the height of a pole formed by plating can be arbitrarily controlled.

EXAMPLE 7

The seventh embodiment of the present invention will now be described with reference to FIGS. 10(A) to 10(E). A difference between this embodiment and the sixth embodiment is that a pole by plating is formed in a through-hole preliminarily formed in the case of this embodiment.

An insulating board 71 is subjected to formation thereon of a metal foil for a conductor circuit, coating of a photoresist, pattern light exposure, plating, removal of the resist, and etching to form a first layer pattern 72 as shown in FIG. 10(A).

Subsequently, a polyimide film 73 is formed, and a through-hole 74 is formed by a mechanical drill or a laser in a portion where connection is desired to be made. Subsequently, a plating liquid and a laser beam are locally supplied to selectively form a pole 75 by plating in the through-hole 74.

What is claimed is:

1. An electroless plating process comprising irradiating a surface of a workpiece with a radiation energy beam to effect activation of the surface necessary for electroless plating,
   wherein irradiation of the surface of said workpiece with said radiation energy beam is effected in an electroless plating liquid to allow activation of the surface and subsequent formation of a plating film to sequentially proceed on said surface, and
   the activation of the surface of said workpiece with said radiation energy beam is effected without a previous activation treatment with an activating liquid.

2. An electroless plating process as claimed in claim 1, wherein said workpiece is a member selected from the group consisting of an organic insulator, an inorganic insulator, and a semiconductor material.

3. An electroless plating process as claimed in claim 1, wherein said radiation energy beam is a laser beam.

4. An electroless plating process comprising irradiating a surface of a workpiece with a radiation energy beam to effect activation of the surface necessary for electroless plating,
   wherein irradiation of the surface of said workpiece with said radiation energy beam is effected in a solution not containing plating ions to allow activation of the surface and subsequent formation of a plating film to sequentially proceed on said surface, subsequently the activated workpiece is immersed in an electroless plating liquid to form a plating film, and
   the activation of the surface of said workpiece with said radiation energy beam is effected without a previous activation treatment with an activating liquid.

5. An electroless plating process as claimed in claim 3, wherein said electroless plating liquid contains at least a copper salt, a copper salt-complexing agent, a reducing agent, and a pH adjuster.

6. An electroless plating process as claimed in claim 3, wherein said electroless plating liquid contains at least a nickel salt, a nickel salt-complexing agent, a reducing agent, and a pH adjuster.

7. An electroless plating process comprising irradiating a plating portion of a workpiece with a radiation energy beam to effect activation of said plating portion necessary for electroless plating so as to form a damaged portion, and
contacting said plating portion of said workpiece with an electroless plating liquid during and/or after the irradiation to selectively form a plating film on said damaged portion;
the activation of said plating portion of said workpiece with said radiation energy beam being effected without a previous activation treatment with an activating liquid.

8. An electroless plating process as claimed in claim 7, wherein said plating film is formed by simultaneously applying said plating liquid and said radiation energy beam to said portion of said workpiece.

9. An electroless plating process as claimed in claim 7 or 9, wherein said plating film is formed by contacting said portion of said workpiece with an electroless plating liquid after formation of said damaged portion.

10. An electroless plating process as claimed in claim 9, wherein said damaged portion is formed by irradiating said portion of said workpiece with said radiation energy beam while contacting said portion with distilled water.

11. An electroless plating process as claimed in claim 9, wherein said damaged portion is formed by irradiating said portion of said workpiece with a radiation energy beam in air.

12. A process for producing a multilayer wiring board comprising supplying a laser beam and a plating liquid to a connector part to form a pole by plating for effecting interlayer connection between a conductor layer and another conductor layer formed thereon in a high-intensity packaging board,
wherein the connector part is irradiated with the laser beam so as to allow activation and subsequent formation of a plating film to sequentially proceed in the plating liquid, and
wherein the activation of the connector part with the laser beam is effected without a previous activation treatment with an activating liquid.

13. A process for producing a multilayer wiring board as claimed in claim 13, wherein an insulating layer is formed after the formation of said pole by plating.

14. A process for producing a multilayer wiring board as claimed in claim 14, wherein said pole by plating is formed in a through-hole preliminarily formed.

15. A process for producing a multilayer wiring board as claimed in claim 14, wherein said plating liquid is a chemical plating liquid.

* * * * *